(12) United States Patent
Katagiri et al.

(10) Patent No.: US 7,781,743 B2
(45) Date of Patent: *Aug. 24, 2010

(54) CHARGED PARTICLE BEAM SYSTEM AND METHOD FOR EVACUATION OF THE SYSTEM

(75) Inventors: Souichi Katagiri, Kodaira (JP); Takashi Ohshima, Saitama (JP)

(73) Assignee: Hitachi High-Technologies Corporation, Tokyo (JP)

( * ) Notice: Subject to any disclaimer, the term of this patent is extended or adjusted under 35 U.S.C. 154(b) by 142 days.

This patent is subject to a terminal disclaimer.

(21) Appl. No.: 12/127,030

(22) Filed: May 27, 2008

(65) Prior Publication Data

US 2008/0315122 A1   Dec. 25, 2008

(30) Foreign Application Priority Data

Jun. 19, 2007 (JP) ............................ 2007-161260

(51) Int. Cl.
  *F04B 37/02* (2006.01)
  *F04B 37/14* (2006.01)
  *H01J 37/301* (2006.01)
(52) U.S. Cl. .................. 250/425; 250/430; 250/496.1; 250/492.3; 315/108; 417/48; 417/51
(58) Field of Classification Search ................. 250/425, 250/430, 496.1, 492.3; 417/48, 51; 315/108
See application file for complete search history.

(56) References Cited

U.S. PATENT DOCUMENTS 4,833,362 A    5/1989  Crewe 5,154,582 A *  10/1992  Danielson .................... 417/51
7,053,589 B2 *  5/2006  Gabrys et al. ............... 74/572.1
7,238,939 B2    7/2007  Katagiri et al.
7,615,765 B2 * 11/2009  Katagiri et al. .......... 250/492.3
2006/0231773 A1 * 10/2006  Katagiri et al. .......... 250/492.1
2007/0102650 A1    5/2007  Katagiri et al.
2009/0294697 A1 * 12/2009  Katagiri et al. .......... 250/492.3

FOREIGN PATENT DOCUMENTS

JP    2006-294481    10/2006

* cited by examiner

*Primary Examiner*—Nikita Wells
(74) *Attorney, Agent, or Firm*—Antonelli, Terry, Stout & Kraus, LLP.

(57) ABSTRACT

The present invention provides a charged particle beam system which can perform evacuation on an electron gun chamber or an ion-gun chamber having a non-evaporable getter pump in a short time and can maintain the ultra-high vacuum for a long time, and a technology of evacuation therefor. Provided is a charged particle beam system equipped with a charged particle optics which makes the charged particle beam emitted from a charged particle source incident on a sample and means of evacuation for evacuating the charged particle optics, characterized in that the evaporation means has: a vacuum vessel with a charged particle source disposed in the vessel; a non-evaporable getter pump which connects with the vacuum vessel through a vacuum pipe and evacuates the interior of the vacuum vessel as a subsidiary vacuum pump; a valve interposed in the vacuum pipe connecting between the vacuum vessel and the non-evaporable getter pump; a rough pumping port which is provided closer to the non-evaporable getter pump than the valve and performs rough pumping; an open and shut valve for opening and shutting the rough pumping port; and a main vacuum pump which is provided closer to the vacuum vessel than the valve and evacuates the interior of the vacuum vessel.

17 Claims, 11 Drawing Sheets

FIG.5

TABLE TIME REQUIRED FOR EACH PROCESS WHEN THE PRESSURE IS VARIED FROM ATMOSPHERIC PRESSURE TO A VACUUM

UNIT : HOUR

| CONDITIONS | PROCESSES | ROUGH PUMPING | BAKING | WAITING TIME | NEG ACTIVATION | WAITING TIME | TOTAL |
|---|---|---|---|---|---|---|---|
| WITH WAITING TIME AFTER BAKING | WITH VALVE | 3 | 8 | 8 | 1 | 1.5 | 21.5 |
|  | WITHOUT VALVE | 3 | 8 | 8 | 1 | 40 | 60 |
| WITHOUT WAITING TIME AFTER BAKING | WITH VALVE | 3 | 8 | 0 | 1 | 5.5 | 17.5 |
|  | WITHOUT VALVE | 3 | 8 | 0 | 1 | 13 | 25 |
| ACTIVATION DURING WAITING TIME AFTER BAKING | WITH VALVE | 3 | 8 | 1 | 1 | 3 | 16 |
|  | WITHOUT VALVE | 3 | 8 | 1 | 1 | 6 | 19 |

CHARGED PARTICLE BEAM SYSTEM AND METHOD FOR EVACUATION OF THE SYSTEM

CLAIM OF PRIORITY

The present invention claims priority from Japanese application JP 2007-161260, filed on Jun. 19, 2007, the content of which is hereby incorporated by reference on to this application.

BACKGROUND OF THE INVENTION

The present invention relates to a charged particle beam system, such as an electron microscope, an electron beam lithography apparatus, and a focused ion beam system, more specifically, to an extremely high degree of vacuum technology of an electron gun or ion gun part.

Conventional scanning electron microscope (SEM) and electron beam writer (EB) each accelerate an electron beam emitted from an electron gun constructed with a field emission type or thermal field emission type electron source, convert it into a narrow electron beam with electron lenses, scan it on a sample as a primary electron beam using a scanning deflector, and perform (in the case of the SEM) detecting secondary electrons or reflected electrons obtainable from the above processes to render an image, or (in the case of the EB) drawing patterns registered in advance on a resist film coated on the sample. As a material of the electron source, in the case of the multi purpose SEM, tungsten is used; for the electron source for inspection of patterns of semiconductors, there is a case where tungsten is made to contain zirconia. Furthermore, in the case of the EB, there may be a case of using $LaB_6$.

In order to make the above-mentioned electron source emit an excellent electron beam current for a long period, it is necessary to maintain an ultra-high vacuum ($10^{-7}$ to $10^{-8}$ Pa) in surroundings of the electron source. For this reason, in the conventional system/apparatus, a method for evacuating the surroundings of the electron gun by ion pumps to construct a differential pressure system is taken. Moreover, there is a charged particle beam system (for example, see U.S. Pat. No. 4,833,362) in which by building a non-evaporable getter pump in the system, the system is made to be able to obtain a higher degree of vacuum.

The non-evaporable getter pump is a pump for chemically absorbing and fixing gas molecules on its surface, and can maintain an evacuation function without supplying energy at all if heating once activates it. With increasing coverage of the alloy surface with gas molecules, a pumping velocity decreases. However, this pump has a feature that if the alloy is reactivated by being heated again, gas molecules adsorbed on the surface diffuse into the inside of the alloy, and fixed eternally, whereby a pure surface is exposed and returns to a state of capable of adsorbing the gas again. In many cases, such metals are hydrogen absorbing alloys, and are used also as pumps for exhausting hydrogen. As a technique of using hydrogen exhaust performance effectively for a long time, a technique is known whereby a hydrogen absorbing alloy is isolated by a valve and the hydrogen absorbing alloy is made to adsorb the gas after exhausting gasses other than hydrogen.

However, since the non-evaporable getter pump has a drawback of being less able to exhaust rare gasses, such as argon gas and helium gas, and gasses which are stable electrochemically, such as methane, the techniques has not been yet in the actual use.

In order to solve this problem, there is a method making combined use of the ion pump and the non-evaporable getter pump (for example, see Japanese Patent Application Laid-Open No. 2006-294481). The ion pump tends to have a smaller pumping velocity and reduced exhaust efficiency when the degree of vacuum becomes higher while the non-evaporable getter pump has a feature that it can maintain high pumping velocity regardless of the degree of vacuum. On the other hand, combined use of the ion pump and the non-evaporable getter pump is effective because it can demonstrate a characteristic which has good points of the ion pump and the non-evaporable getter pump, by compensating a drawback of the non-evaporable getter pump that the rare gasses, such as argon gas and helium gas, described above and electrochemically equilibrated gasses, such as methane, are hard to exhaust with the ion pump.

SUMMARY OF THE INVENTION

However, the non-evaporable getter pump has an undesirable characteristic that heating during the time of activating the alloy is attended with generation of a large amount of gas. Here, note that the non-evaporable getter pump means a vacuum pump constructed with the alloy for adsorbing gases only by being heated (being activated) without evaporating the getter. In many cases, the alloy is a hydrogen absorbing alloy, having a characteristic of desorbing hydrogen during the time of activation. In addition to this, when the alloy is heated to 350 to 600° C. which is required for activation, the gas desorbed from a wall surface increases, and therefore the alloy will emit a large amount of the gas.

This desorbed gas should be exhausted when the degree of vacuum is made to reach a high degree of vacuum of $10^{-7}$ to $10^8$ Pa. Exhausting the gas becomes a cause to present two problems: a problem that it takes a long time to do this exhaustion; a problem that exhaustion shortens a life of the non-evaporable getter pump which is used together with an ion pump.

Therefore, the object of the present invention is to provide a charged particle beam system that is capable of performing evacuation of the charged particle source chamber having the non-evaporable getter pump in a short time and maintaining a high degree of vacuum for a long time, and a sequence of the evacuation for the charged particle beam system.

In order to attain the objects, the charged particle beam system of the present invention has: a vacuum vessel with a charged particle source (electron source, ion source, or the like) disposed in it; the non-evaporable getter pump as a subsidiary pump; a vacuum pipe for connecting between the vacuum vessel and the subsidiary pump; a valve provided in the vacuum pipe; a main vacuum pump provided closer to the vacuum vessel than the valve in the vacuum pipe; a rough pumping port provided closer to the subsidiary pump than the valve in the vacuum pipe; and a rough pumping valve provided in the rough pumping port.

Below, characteristic configuration examples of the present invention will be enumerated.

(1) The charged particle beam system of the present invention is a charged particle beam system equipped with a charged particle optics which makes a charged particle beam emitted from the charged particle source incident on a sample and means of evacuation for evacuating the charged particle optics, characterized in that the means of evacuation has: the vacuum vessel with a charged particle source disposed in the vessel; the non-evaporable getter pump which connects with the vacuum vessel through the vacuum pipe and evacuates the interior of the vacuum vessel as a subsidiary vacuum pump; a valve interposed in the vacuum pipe connecting between the vacuum vessel and the non-evaporable getter pump; a rough pumping port which is provided closer to the non-evaporable getter pump than the valve and performs rough pumping; an open and shut valve for opening and shutting the rough pumping port; and a main vacuum pump which is provided closer to the vacuum vessel than the valve and evacuates the vacuum vessel.

(2) The charged particle beam system of the present invention is the charged particle beam system of the above-mentioned configuration, characterized in that the valve connecting between the vacuum vessel and the non-evaporable getter pump is capable of switching a conductance in a range of three orders of magnitude or more and a conductance when the valve is fully opened is 100 L/s or more.

(3) The charged particle beam system of the above-mentioned configuration, characterized in that the valve interposed in the vacuum pipe connecting between the vacuum vessel and the non-evaporable getter pump is a gate valve or a butterfly valve.

(4) The charged particle beam system of the above-mentioned configuration, characterized in that the valve interposed in the vacuum pipe connecting between the vacuum vessel and the non-evaporable getter pump has a mechanism for opening and shutting the vacuum pipe by driving a bimetal or a shape memory alloy.

(5) The charged particle beam system of the above-mentioned configuration, characterized in that the vacuum vessel is an ion gun chamber with an electron source or an ion source provided in the chamber.

(6) The charged particle beam system of the above-mentioned configuration, characterized in that the main vacuum pump is an ion pump.

(7) A charged particle beam system of the present invention is a charged particle beam system equipped with a charged particle optics which makes a charged particle beam emitted from a charged particle source incident on a sample and means of evacuation for evacuating the charged particle optics, characterized in that the means of evacuation has the ion pump and the non-evaporable getter pump which connect with the vacuum vessel with a charged particle source disposed in it through the vacuum pipe, respectively, and is set up to use the non-evaporable getter pump as the subsidiary pump to be used together with the ion pump and subsidiary evacuate individually at the time of activation.

(8) A method for evacuation, by the present invention, of a charged particle beam system which has the non-evaporable getter pump which connects with the vacuum vessel with a charged particle source disposed in the vessel through an aperture, a valve interposed in the vacuum pipe connecting between the non-evaporable getter pump and the vacuum vessel, a rough pumping port provided closer to the non-evaporable getter pump than the valve, an open and shut valve of the rough pumping port, and a main vacuum pump provided closer to the vacuum vessel than the valve, characterized by including the steps of: performing rough pumping by opening the open and shut valve of the rough pumping port; baking the valve interposed in the vacuum pipe connecting between the vacuum vessel and the non-evaporable getter pump at roughly 250° C. or less; cooling the valve to the vicinity of room temperatures after the baking; activating the non-evaporable getter pump by heating the pump after shutting the valve provided between the vacuum chamber and the non-evaporable getter pump after the cooling; and opening the valve after the activation.

Alternatively, a method for evacuation, by the present invention, of a charged particle beam system which has the non-evaporable getter pump connected to a vacuum vessel with a charged particle source disposed in the vessel through an aperture, a valve interposed in the vacuum pipe connecting between the non-evaporable getter pump and the vacuum vessel, a rough pumping port provided closer to the non-evaporable getter pump than the valve, an open and shut valve of the rough pumping port, and a main vacuum pump provided closer to the vacuum vessel than the valve, characterized by including the steps of: performing rough pumping by opening the open and shut valve of the rough pumping port; baking the valve interposed in the vacuum pipe connecting between the vacuum vessel and the non-evaporable getter pump at roughly 250° C. or less; activating the non-evaporable getter pump by heating the pump after shutting the valve provided between the vacuum chamber and the non-evaporable getter pump after the baking; and opening the valve after the activation.

According to the present invention, the charged particle beam system equipped with an electron gun chamber or an ion gun chamber making combined use of the non-evaporable getter pump which has a short evacuation time and can maintain as high a degree of vacuum as $10^7$ to $10^8$ Pa for long time and the main vacuum pump, and a method for evacuation therefor can be provided.

BRIEF DESCRIPTION OF THE DRAWINGS

FIG. 5 is a diagram for explaining a summary of the experimental evaluation results of the present invention;

DETAILED DESCRIPTION OF THE PREFERRED EMBODIMENTS

Hereafter, embodiments of the present invention will be described in detail with reference to the drawings.

First Embodiment

Figure 1:
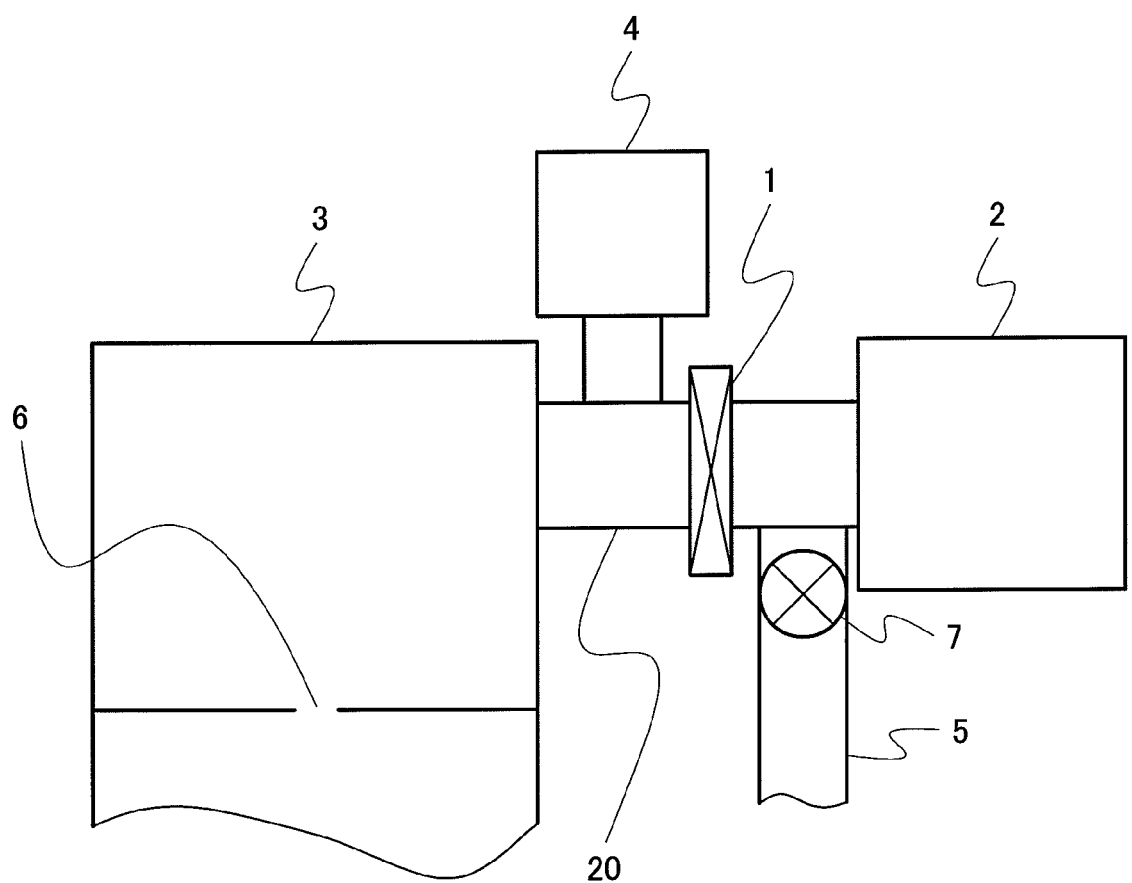
FIG. 1 is a diagram for explaining an evacuation configuration according to one embodiment of the present invention.

FIG. 1 shows a typical configuration example of the present invention. A vacuum vessel 3 is equipped with an electron source (not illustrated), which emits electrons downward. The emitted electron beam passes through an aperture 6, further passes through an electron optics provided under it, and falls on a sample. Further explanation is omitted here.

The vacuum vessel 3 with an electron source disposed in it connects with a main vacuum pump 4, a subsidiary vacuum pump 2, a valve 1, and a rough pumping port 5 through a vacuum pipe 20. As the main vacuum pump 4, an ion pump may be used, for example. As the subsidiary vacuum pump 2, a non-evaporable getter pump is used. At this time, the subsidiary pump 2 and a rough pumping port 5 are located on the opposite side to the vacuum vessel 3 across the valve 1, and the main pump 4 is located on the vacuum vessel 3 side across the valve 1.

That is, the means of evacuation according to this embodiment has: the vacuum vessel 3 with the electron source disposed in it; the non-evaporable getter pump which connects with the vacuum vessel 3 through the vacuum pipe 20; the valve 1 interposed in the vacuum pipe 20 connecting between the vacuum vessel 3 and the non-evaporable getter pump; a rough pumping port 5 and a rough pumping valve 7 provided closer to the non-evaporable getter pump than the valve 1; and the main vacuum pump 4 provided closer to the vacuum vessel 3 than the valve 1.

For the valve 1, a gate valve, a butterfly valve, etc. are desirable, but it is not limited to these in particular. Specifications required for this valve will be described later.

A method for evacuation of the present invention will be explained. Fundamental evacuation steps of evacuating from the atmospheric pressure to an ultra-high vacuum are as follows.

(1) The valve 1 and the rough pumping valve 7 are opened, and rough pumping is performed using an unillustrated turbomolecular pump which connects with the rough pumping port 5.

(2) When the degree of vacuum reaches the range of $10^{-5}$ Pa, heaters (not illustrated) attached to several parts are electrified to perform baking. The heater temperature is maintained at a setup temperature of 200 to 250° C. for about eight hours. This step aims at making the gas adhering to an inner wall surface of the vacuum vessel desorb.

(3) The valve 1 is shut, and the non-evaporable getter pump is activated by heating. The heating temperature of the non-evaporable getter pump is maintained at about 500° C. for one hour. After that, the heating is ended.

(4) The rough pumping valve 7 is shut and the valve 1 is opened, and this state is left until the degree of vacuum is improved.

An experiment to measure the evacuation time and the degree of vacuum reached in the case where the evacuation was performed by the above sequence was conducted to evaluate effects of the present invention.

Figure 2:
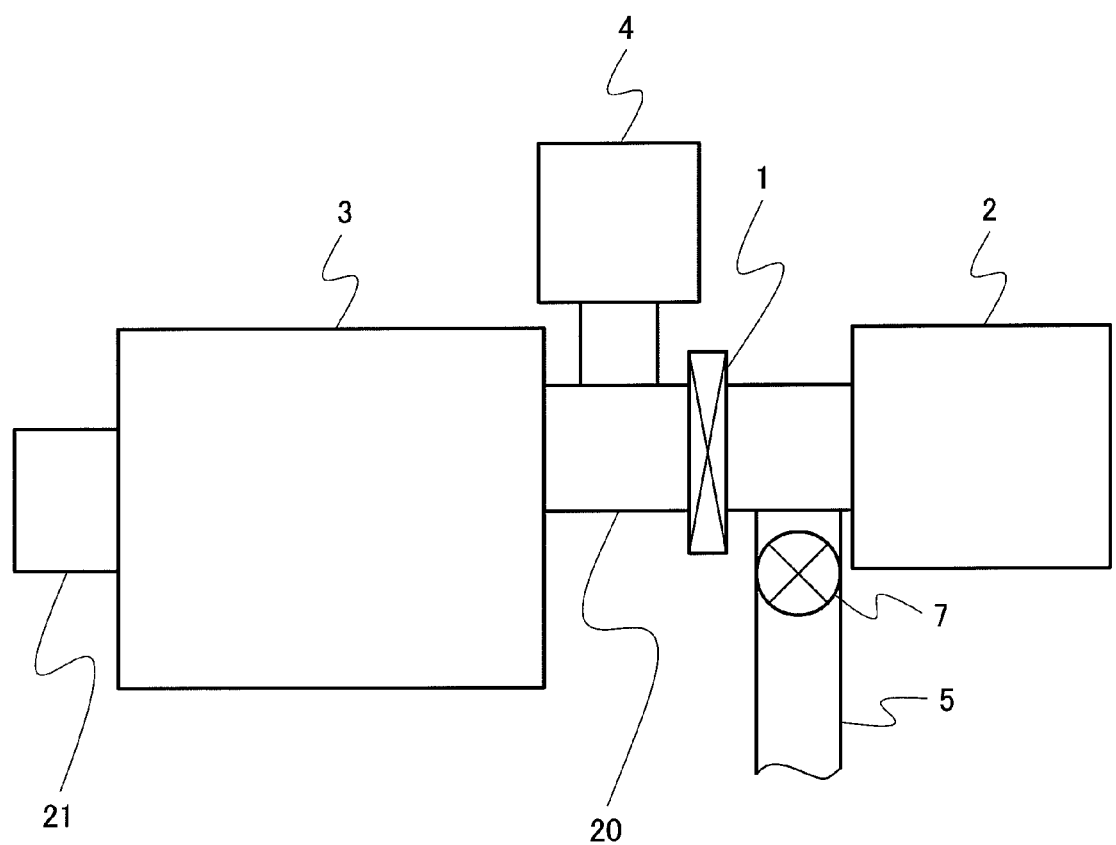
FIG. 2 is a diagram for explaining an experiment configuration in which an effect of the present invention was verified.

A configuration of the experimental apparatus will be explained using FIG. 2. The experimental apparatus is given a configuration of FIG. 2 which uses an ion pump (IP) 4 (pumping velocity: 20 L/s) as a main pump, uses a zirconium/vanadium-based alloy which is activated by low temperature (activation temperature: 350° C.) as the non-evaporable getter pump, uses a gate valve (GV) (aperture size: ICF70 standard) as the valve 1, and uses a vacuum vessel which was an ICF152 flanged pipe with piping of ICF70 welded to it as the vacuum vessel 3. It also has a vacuum gauge 21 for measuring the degree of vacuum inside the vacuum vessel. Incidentally, since the aperture 6 through which the electron beam passes has no relation with this evaluation, it is not provided. For the baking, it is decided to use a ribbon heater wrapped on the outer wall, and the heater is in a configuration that enables target temperature control with a thermocouple. Moreover, for the activation of the non-evaporable getter pump, a 400-W heater (not illustrated) is used and is in a configuration so as to be able to heat a non-evaporable getter alloy up to about 550° C.

The evaluation experiment was conducted for two cases. One case: the non-evaporable getter pump was activated by heating under a condition that the valve 1 did not exist (the valve 1 was fully opened) as conventionally. Another case: the non-evaporable getter pump was activated by heating after the valve 1 was shut in the step (3), which is a condition of the present invention.

Figure 3:
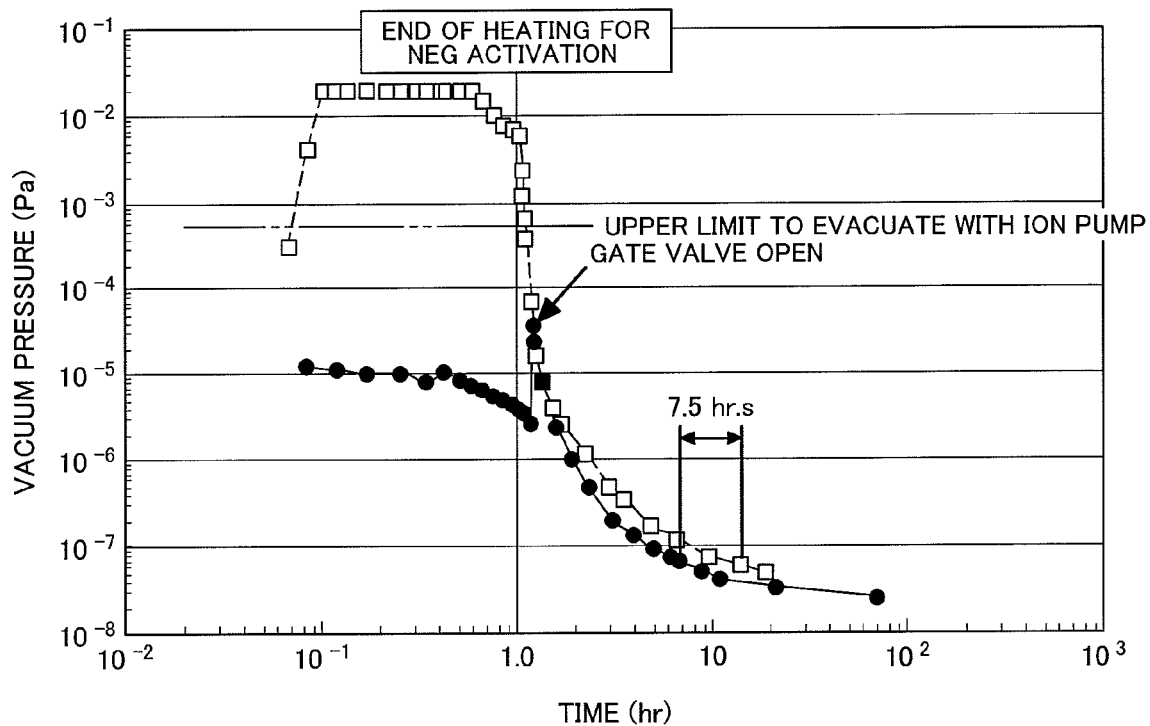
FIG. 3 is a diagram for explaining an experimental evaluation result (1) of the present invention.

FIG. 3 is a result of plotting temporal change of the degree of vacuum inside the vacuum vessel from immediately after completion of the steps (1), (2).

A plot of open rectangles in the figure shows the conventional case. The vacuum pressure inside the vacuum vessel became as large as exceeding $10^{-2}$ Pa which was a measurement limit of the vacuum gage by the gas generated during the activation of the non-evaporable getter pump. For this reason, the ion pump 4 must be cut off from a power supply. When the heating of the non-evaporable getter pump was stopped after a lapse of one hour from the activation, the vacuum pressure inside the vacuum vessel decreased. A vacuum waiting time required for the degree of vacuum to become $7 \times 10^{-8}$ Pa at which the electron gun could emit electrons was about 13 hours.

On the other hand, in the case of existence of the valve of the present invention which is shown by a plot of sold rectangles in FIG. 3, since the valve 1 was shut at the time of the activation of the non-evaporable getter pump, a vacuum pressure in the range of $10^{-5}$ to $10^{-6}$ Pa could be maintained. For this reason, the ion pump 4 could be operated, and the vacuum pressure inside the vacuum vessel 3 was being decreased even during the activation of the non-evaporable getter pump. Furthermore, at a time point of a lapse of 10 minutes after end of the activation of the non-evaporable getter pump, the valve 1 was opened and decrease of the vacuum pressure was waited. The vacuum waiting time required for the chamber of the electron gun to become $7 \times 10^{-8}$ Pa at which the electron gun could emit electrons was about 5.5 hours.

From the above result, as an effect of the present invention in the case of activating the non-evaporable getter pump continuously from the baking, it was proved that the evacuation time to a desired degree of vacuum was able to be shortened by 7.5 hours.

Since the non-evaporable getter pump exhausts gas molecules by making them adhere on the surface of the alloy, it has a characteristic that as an amount of exhaust adsorption after the activation increases, the pumping velocity decreases. In such a case, by re-heating the non-evaporable getter alloy, gas molecules adsorbed on the surface diffuse into the inside of the alloy, a pure alloy surface is exposed again, and the pumping velocity returns to a previous value. This is called reactivation. At this time, only hydrogen gas will be reemitted without diffusing into the inside.

An evaluation experiment conducted next is for a case where the reactivation is assumed. That is, this experiment is to evaluate a required time in the case of activating the non-evaporable getter pump in a state where the vacuum baking of the system has completed by evacuation steps (1), (2) described above and the vacuum pressure has reached the range of $10^{-8}$ Pa after setting the waiting time sufficiently.

An experiment method is a method whereby a waiting time more than or equal to eight hours has been set after the completion of the steps (1), (2) described above, and the experiment is allowed to proceed to a step (3) at a time point when the temperature of the experimental apparatus becomes a room temperature.

Figure 4:
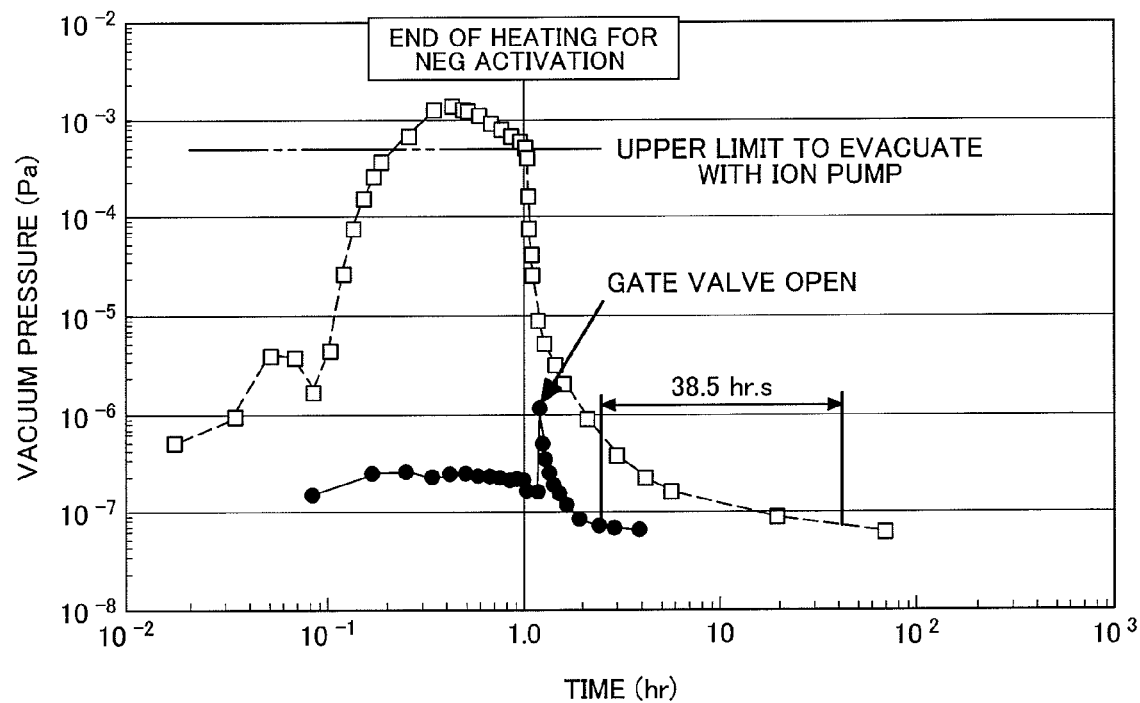
FIG. 4 is a diagram for explaining an experimental evaluation result (2) of the present invention.

FIG. 4 shows the result. In the case of the conventional method for evacuation, although the activation exerts a less influence than activation done immediately after the baking, the vacuum pressure increases abruptly due to the gas generated at the time of activation and reaches a level higher than $5 \times 10^{-4}$ Pa at which it becomes difficult for the ion pump to exhaust the gas. A waiting time from the decrease of the vacuum pressure after the activation until a degree of vacuum becomes $7 \times 10^{-8}$ Pa at which the electron gun can emit electrons is 40 hours, which is prolonged by 27 hours compared to the waiting time under a condition of the activation immediately after the baking. This is because, since the inner wall surface of the vacuum vessel returned to a room temperature, it is considered that the gas incident to activation of the non-evaporable getter pump becomes easy to adhere to the surface, and accordingly a time required to exhaust the gas becomes long.

On the other hand, in the case where the method for reactivation using the present invention is used, it was demonstrated that since the valve 1 was shut before heating of the non-evaporable getter pump which was done for the reactivation, the vacuum pressure of the vacuum vessel during the reactivation maintained the range of $10^{-7}$ Pa; therefore, a time to wait reduction of the vacuum pressure by opening the valve 1 at 10 minutes after the heating was very short, about 1.5 hours being sufficient for that. A difference of time required for the reactivation between with the valve and without the valve becomes as large as 38 hours. A factor for this shortening can be said to attribute to a fact that desorbed gas incident to the reactivation does not adhere to the inner wall surface of the vacuum vessel 3.

From experimental evaluation so far conducted, it was found that the present invention was very effective in reactivating the non-evaporable getter pump. On the other hand, in a continuous process of evacuating the chamber from the atmospheric pressure, as summarized in FIG. 5, although it has an effect, it takes 17.5 hours at the shortest. Then, in order to further shorten this required time, a third method for evacuation in which the non-evaporable getter pump gets activated during a waiting time after end of the baking is performed.

This method is a method specified by the third condition column in a table shown in FIG. 5, and a feature of the method is that with a pause of one hour of the waiting time after the baking, the non-evaporable getter pump is reactivated. This method aims at solving a probable cause that, when the activation is performed immediately after the baking, the gas desorbed from the inner wall surface of the vacuum vessel 3 when being heated by the baking is a large amount, which prolongs the last waiting time.

By this experiment, a result shown in the third condition column in a table shown in FIG. 5 was obtained. That is, the evacuation time from the atmospheric pressure is shortened most and the evacuation can be done in 16 hours.

Next, specifications required for the valve 1, which is a key device of the present invention, will be given. A conductance of the valve 1 at the time of being opened needs to be sufficient not to bar the pumping velocity of the non-evaporable getter pump. Since the pumping velocity is about 100 to 200 L/s in many cases, a conductance at the time of being opened of 100 L/s or more does not cause a problem from a practical standpoint.

Further, the conductance of the valve 1 at the time of being shut will be explained. In the evaluation experiment described above, the gate valve (GV) was used. When seeing the FIGS. 3 and 4, as the conductance required for the valve 1 at the time of being shut, a value which is three to four orders of magnitude lower than the value at the time of being opened is sufficient. That is, conductance change performance (about $10^{12}$) as high as be able to isolate the vacuum from the atmospheric pressure is unnecessary. Therefore, although it is natural that the gate valve and the butterfly valve capable of large conductance switching are effective, a simplified valve which will be described below is also effective as the valve 1.

Figure 6:
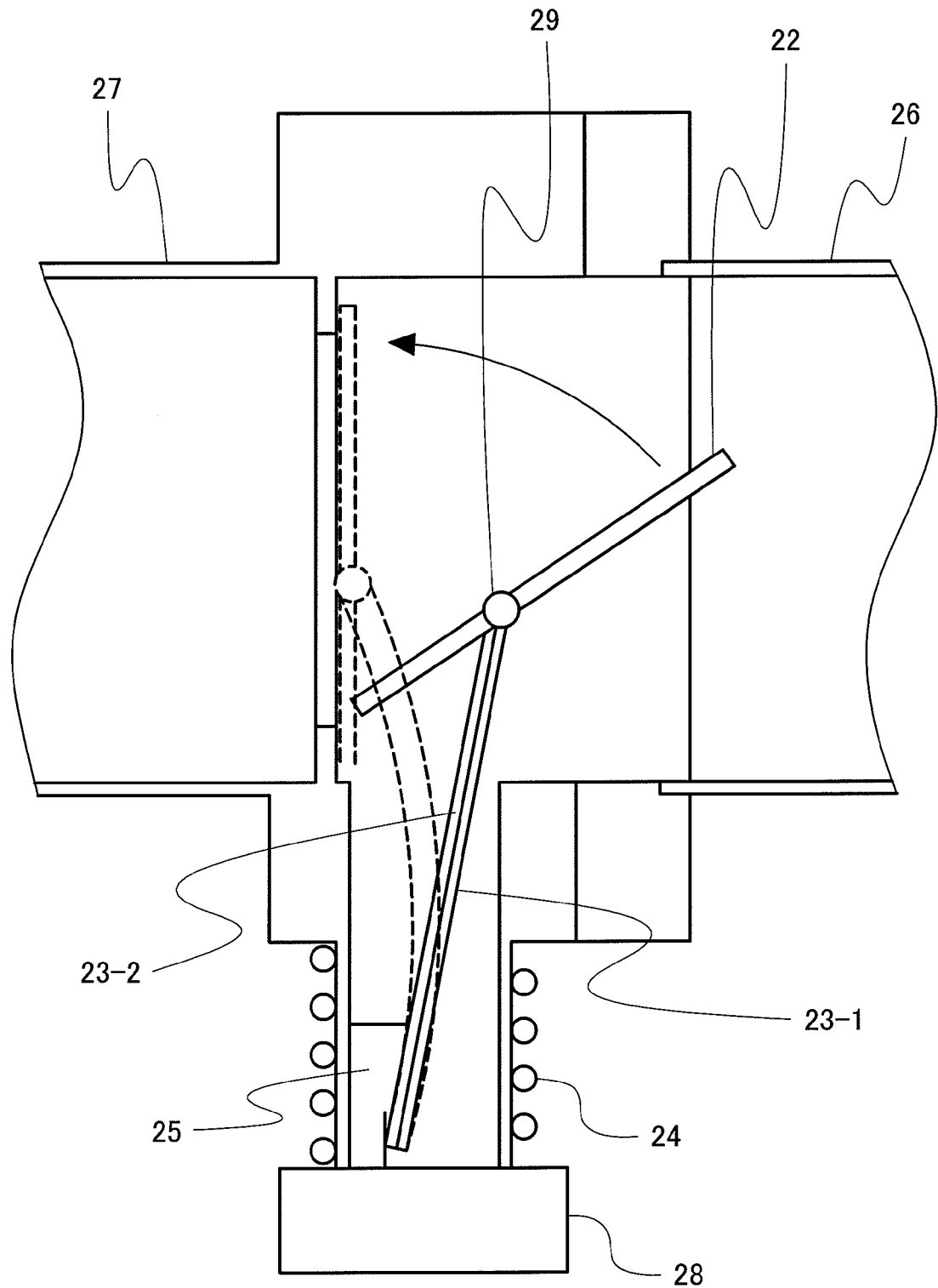
FIG. 6 is a diagram for explaining one example of a valve structure used in the present invention.

FIG. 6 shows a structure of the valve using a bimetal, as a cross section in the vacuum pipe. A vacuum pipe 27 with a flange and a vacuum pipe 26 with a flange are connected to the vacuum vessel 3 (not illustrated) and the subsidiary pump 2, respectively. Piping 28 with a mini flange is welded to the vacuum pipe 27 with a flange. Bimetal 23 which is to be cantilevered by a stationary part 25 is being fixed thereto. This bimetal is a combination of Inconel 23-1 (being spring materials) and tungsten 23-2, which are stuck together by welding. The both materials are of nonmagnetization, and do not have a harmful influence on an electron beam through generation of magnetism. A coefficient of thermal expansion of Inconel 23-1 is $14.5 \times 10^{-6}$ and that of tungsten 23-2 is $4.5 \times 10^{-6}$. The ratio of these coefficients of thermal expansion is a combination which can be maintained without varying largely from a room temperature to about 600° C. Since low thermal expansivity in a wide temperature range is rare, the combination can be said as a desirable one for the present invention.

Further, since tungsten 23-2 is a metal material which does not exhibit plastic deformation, it should be used as a plane sheet in a neutral condition where no load is applied thereto. In this configuration, the bimetal 23 is two rectangular sheet plates of 0.3 mm thickness cemented together, and is supported slantingly by the stationary part 25.

A function of this valve will be explained. The bimetal 23 is in the shape shown as a solid line of FIG. 6 in a room temperature, and a lid 22 is held opened. The lid 22 is connected with the bimetal 23 through a swivel 29, which gives the lid 22 a structure freely rotatable in the paper plane. A position of this swivel 29 is lower than the center-of-gravity position of the lid 22, and therefore in a room temperature state shown by a solid line of FIG. 6, the lid 22 is slanted horizontally by gravity, so that the lid is configured to increase the conductance.

The stationary part 25 of the bimetal 23 is being fixed to a mini vacuum pipe 28 welded to the vacuum pipe 27, and a seize heater 24 is wrapped around the atmosphere side of the mini vacuum pipe 28. The bimetal 23 is given a function of deforming itself by being heated which results from heating of this seize heater 24. When the temperature of the bimetal 23 becomes about 300° C. by heating, it will deform as shown by a dashed line, the lid 22 will block the aperture, which will result in switching of the conductance to a smaller value. Even with an open and shut valve based on very light surface contact of metals which do not have especially vacuum seal materials as in this configuration, it is possible to switch the conductance in a range of three orders of magnitude or more.

This valve has a simple structure and is capable of controlling valve opening and shutting only by being heated, having effects of easy operation and also attainment of cost reduction. What is necessary to use it is just to change the conductance to a smaller value by, when activating the non-evaporable getter pump which is a subsidiary pump, electrifying the seize heater 24 to heat it simultaneously.

Although in this structure, the example which used the bimetal was disclosed, the same effect can be obtained using a shape memory alloy in stead of the bimetal.

Next, details of the non-evaporable getter pump 2 will be explained. The non-evaporable getter pump used here is required to have a high pumping velocity and to prolong a period during which a practical pumping velocity can be maintained by one time of activation as long as possible. Then, the inventors have devised the non-evaporable getter pump 2-1 in which a sheet non-evaporable getter alloy 50 is folded many times and is wrapped around a vacuum flange 51 having a rod form heater part so that getter parts are installed in a high density. The non-evaporable getter alloy 50 placed in the vacuum can be activated by heating it by inserting a rod form heater 52 into a rod form part of the vacuum flange 51 having a rod form heater part from the atmosphere side.

Figure 11:
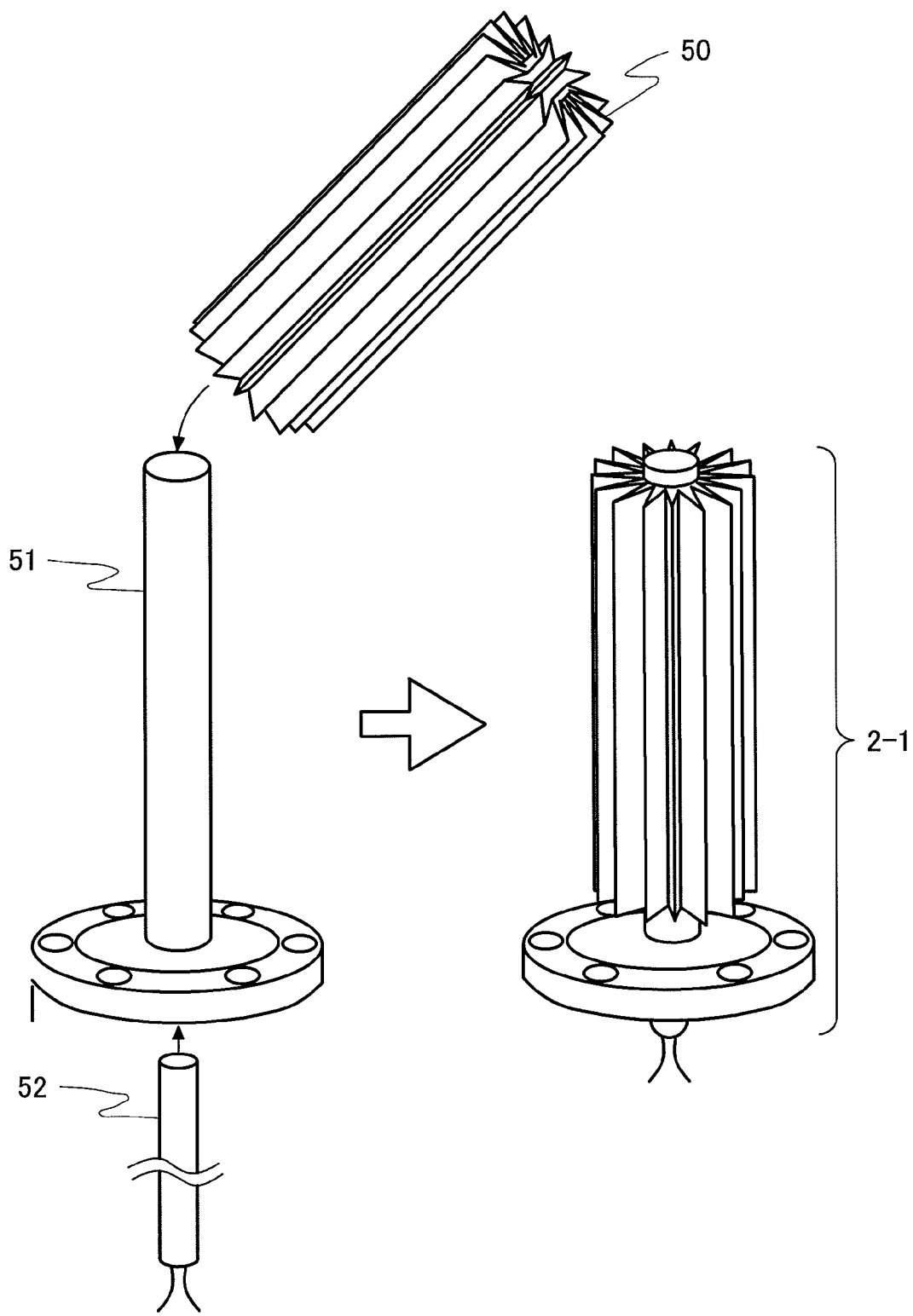
FIG. 11 is a diagram for explaining one example of a configuration of a subsidiary type non-evaporable getter pump.
Figure 12:
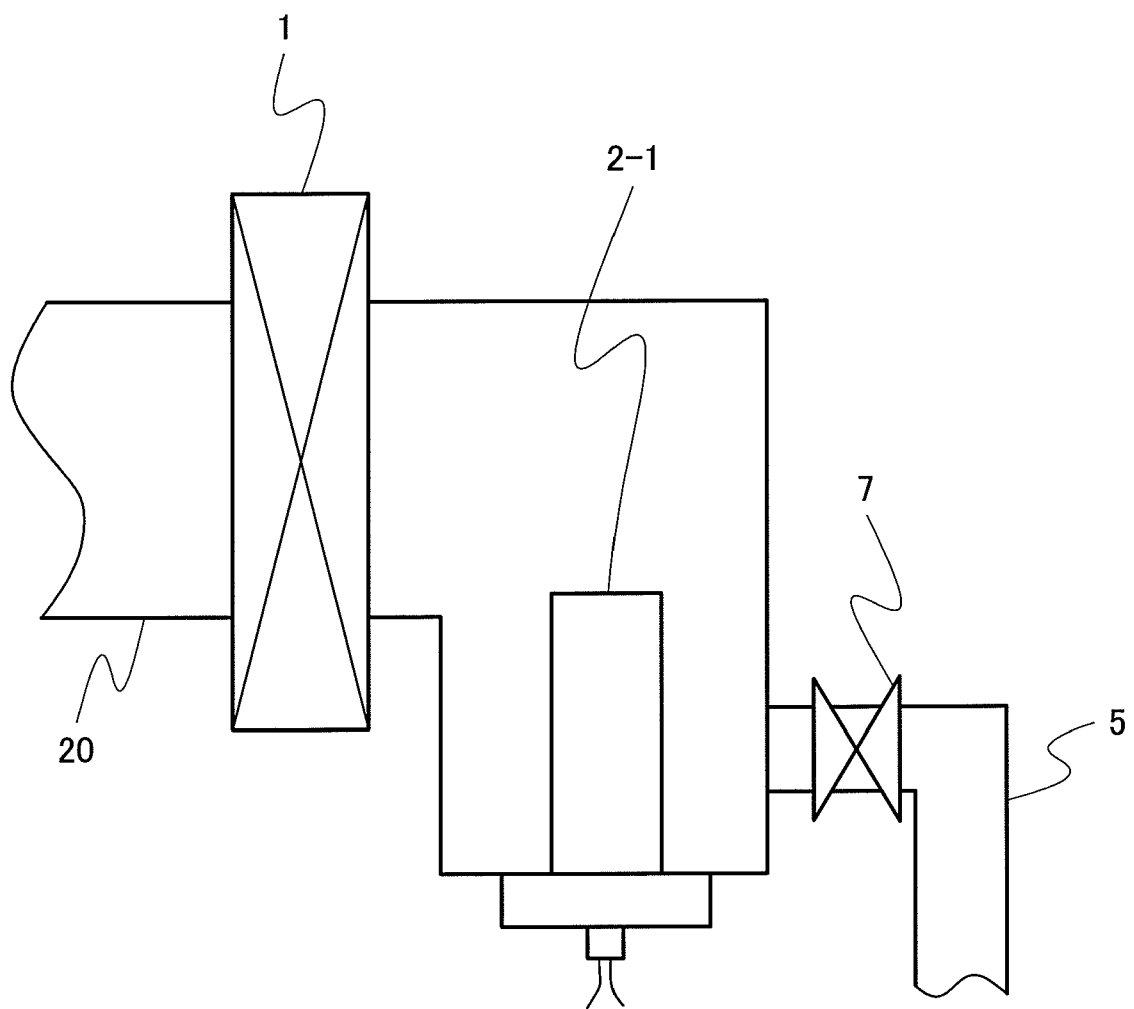
FIG. 12 is a diagram for explaining an arrangement configuration of the subsidiary type non-evaporable getter pump.

FIG. 12 shows an attachment configuration of the non-evaporable getter pump 2-1. The valve 1 of the present invention is placed in the vacuum pipe 20 which connects with the vacuum vessel 3 with the electron gun disposed in it. Downstream the valve 1, the non-evaporable getter pump 2-1 is attached at a lower level than an aperture of the valve 1. This structure is taken because, even if a piece of the alloy drops from the surface of the non-evaporable getter alloy 50 shown in FIG. 11, it falls just downward being attracted by the attraction, so that it may not invade into the vacuum vessel 3. Moreover, it is advisable that the rough pumping port 5 is provided near the non-evaporable getter pump 2-1 in order to exhaust efficiently the gas desorbed in activating the non-evaporable getter pump 2-1 by heating. In this embodiment, the port is provided on the side of the non-evaporable getter pump 2-1.

By taking such a configuration, new effects of preventing a foreign matter from invading into the vacuum vessel 3 and efficient exhaust of the desorbed gas can be acquired.

Second Embodiment

In this embodiment, a case where the evacuation configuration so far described in the First embodiment is applied to the scanning electron microscope will be explained.

Figure 7A:
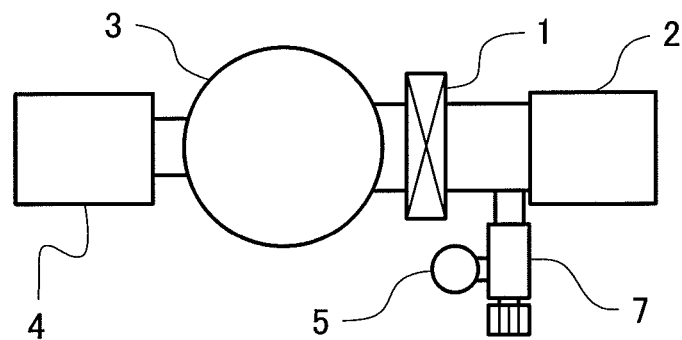
FIGS. 7A and 7B are diagrams for explaining one configuration example of the scanning electron microscope which uses the present invention.
Figure 7B:
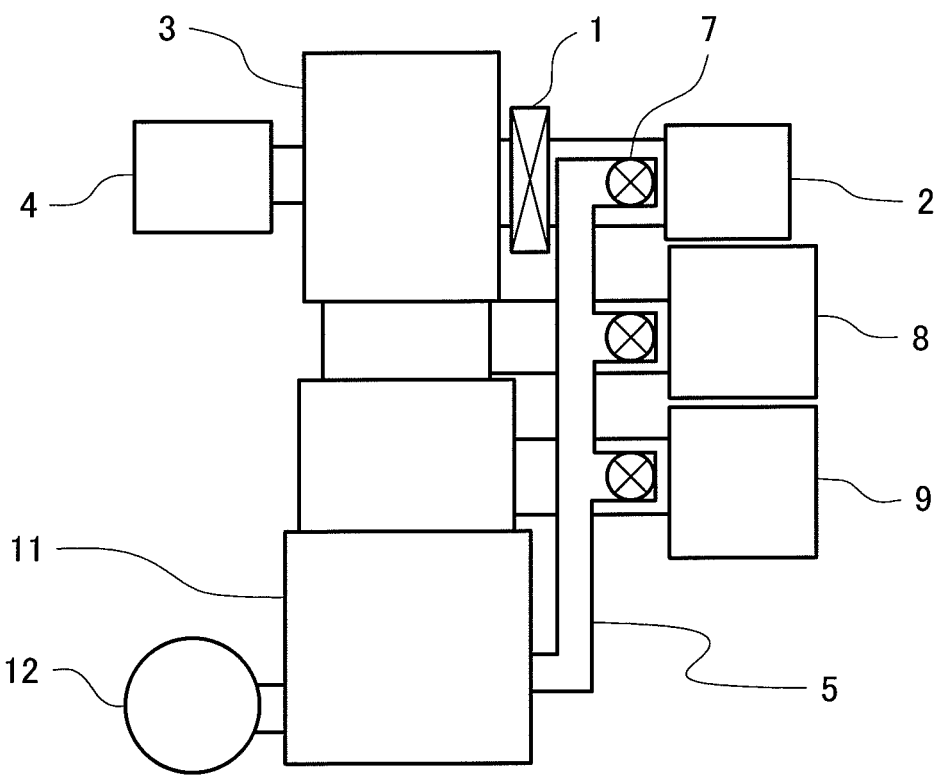

FIGS. 7A and 7B show an outline configuration of the scanning electron microscope according to this embodiment. FIG. 7A show a diagram of the scanning electron microscope viewed from the above, in which there is the vacuum vessel 3 with an electron gun disposed in its most upper part, and the ion pump 4 which is a main pump is connected to the vacuum vessel 3 through the vacuum pipe. On the opposite side, the non-evaporable getter pump 2, which is the subsidiary pump 2, is provided to the vacuum pipe through the valve 1. On the subsidiary pump 2 side across the valve 1, there is the rough pumping port 5, which is connected to the vacuum pipe through the rough pumping valve 7.

As shown in FIG. 7B, under the vacuum vessel 3 with the electron gun disposed in it, there are columns having the built-in electron optics, each column having an independent vacuum vessel. In this embodiment, the two vacuum vessels are connected with each other to make up a differential pumping system and the vacuum vessels are vacuum-evacuated by individual pumps 8, 9. In this embodiment, the system assumes a configuration in which the vacuum vessels other than the vacuum vessel of the electron gun are vacuum-evacuated by the ion pump, which is the main pump. The rough pumping port 5 adopts a structure which can isolate the vacuum vessels with an exclusive rough pumping valve.

Next, the method for evacuation in this embodiment will be explained. When the evacuation is performed from the atmospheric pressure, a turbo-molecular pump 12 connected to a sample chamber 11 is driven so that the rough pumping of the whole system may be performed. At this time, all the rough pumping valves 7 and the valve 1 of the present invention are being opened. The baking of system is started when the degree of vacuum of the whole system enters the range of $10^{-5}$ Pa. A target temperature at this time is in a range of 200 to 250° C., and the baking is controlled so that its temperature may be in this range. For a baking time, about 8 to 10 hours may be sufficient. Steps following this step may be thought to be fundamentally the same as were described in the First embodiment. What is different is an open/shut period of the rough pumping valve provided on a downstream side of the electron gun. What is necessary is to shut these rough pumping valves before activating the non-evaporable getter pump after the end of the baking.

By doing in this way, it is possible for each of the ion pumps 8, 9 which are provided individually to establish an ultra-high vacuum without being affected by a large amount of the gas generated at the time of activation.

Third Embodiment

Figure 8:
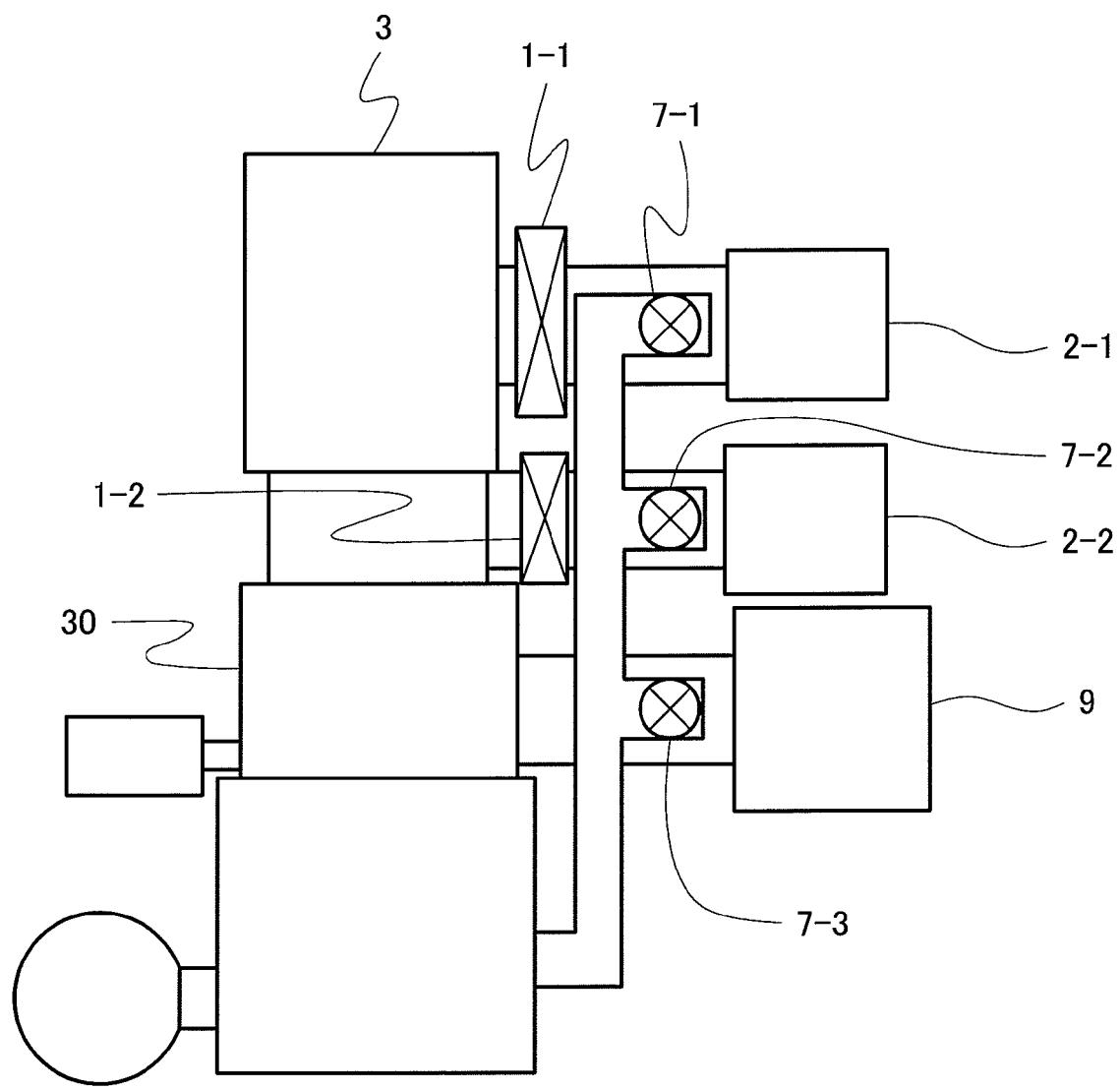
FIG. 8 is a diagram for explaining another configuration example of the scanning electron microscope which uses the present invention.

In this embodiment, a case where the present inventions is applied to the scanning electron microscope so far described in the Second embodiment in another configuration will be explained using FIG. 8.

This embodiment is an example where the ion pumps are reduced as much as possible to be only a single pump. The embodiment assumes a configuration in which the electron gun chamber 3 and the vacuum vessel immediately below it are provided only with the non-evaporable getter pumps 2-1, 2-2 (the ion pumps were removed), and only a third vacuum vessel 30 is evacuated by the ion pump 9. In this case, there are effects that the ion pumps are cut, and miniaturization and lightening of the scanning microscope are attained.

The method for evacuation is almost equivalent to that of the Second embodiment. The following can be attained: In activating the non-evaporable getter pumps 2-1, 2-2, valves 1-1, 1-2 are shut and rough pumping valves 7-1, 7-2 are opened, so that a large amount of the desorbed gas may not be allowed to go into the interior of the column. At the same time, by shutting a rough pumping valve 7-3 on the ion pump 9 side, the ion pump 9 is protected from a large amount of the gas.

Fourth Embodiment

Figure 9:
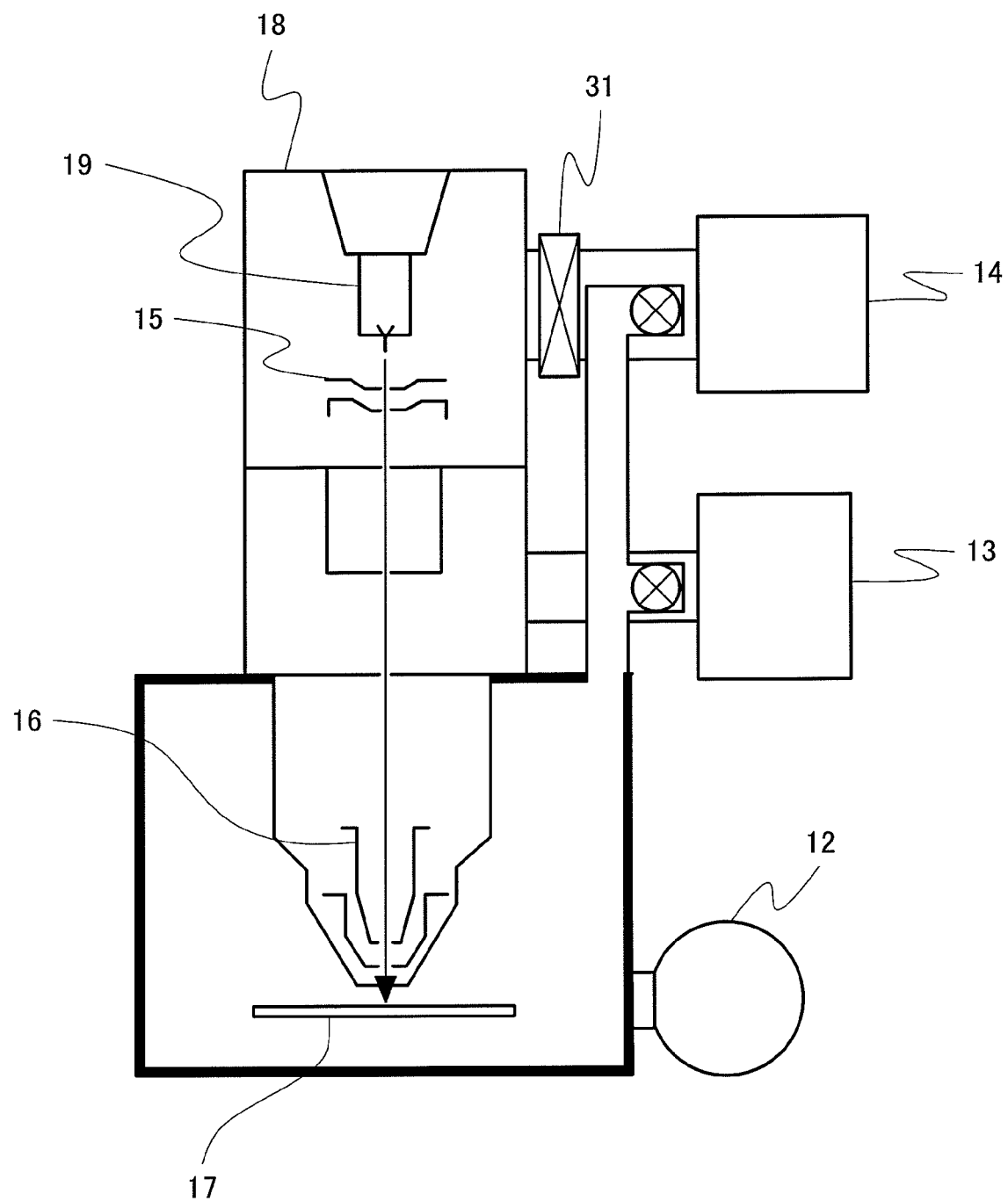
FIG. 9 is a diagram for explaining one configuration example of a focused ion beam system which uses the present invention.

In this embodiment, an example of applying the present invention to the focused ion beam system (FIB) will be explained. FIG. 9 shows an outline configuration of the whole system.

What is shown is a focused ion beam system, characterized by adopting a differential pumping system in which two or more vacuum vessels are connected through apertures, and characterized by providing a non-evaporable getter pump 14 in the upstream vacuum vessel, providing a valve 31 between the non-evaporable getter pump 14 and an ion gun chamber 18, providing an ion pump 13 in the downstream vacuum vessel, and providing an ion source 19 in the most upstream vacuum vessel.

The FIB (Focused Ion Beam) system is a system for processing a sample surface by striking ion particles each of which is heavier than an electron on a sample 17, and detecting electrons generated from a site on which the ion beam is irradiated to observe its image and conduct other things, like the SEM.

Since, for an optics for focusing the ion beam, an electrostatic optics composed of a plurality of electrodes 15, 16 is used, it does not use electromagnetic lenses using coils as those of the scanning electron microscope. For this reason, since high heat resistance can be secured compared to the scanning electron microscope, it has a feature that the non-evaporable getter pump 14 can be introduced easily.

The ion source 19 of the FIB system is disposed in the most upstream of the ion beam and a degree of vacuum of about $10^{-8}$ Pa needs to be maintained. For this reason, the system adopts a differential pumping configuration like the scanning electron microscope described in the first embodiment. In the case of FIG. 9, two-stage differential pumping is performed, and conventionally two ion pumps are used for this. The system can be minimized and reduced in weight by altering one of these upstream ion pumps to the non-evaporable getter pump 14. Further, if the ion pump is altered to a sputter ion pump, it will be preferable that the system can be minimized further because the exhaust efficiency of a rare gas which is hard for the non-evaporable getter pump to exhaust will be increased.

It can be said that basically the configuration of the FIB system is almost the same as the configuration of the scanning electron microscope described in the Second embodiment. The valve 31 is provided between the non-evaporable getter pump 14 provided as the subsidiary pump and the ion gun chamber 18. A method for evacuation from the atmospheric pressure may be completely the same as in the case of the Second embodiment.

Since other parts of the configuration are the same as those of the conventional FIB system, no detailed explanation is given here particularly. It is possible to apply to systems other than the electron beam system.

Fifth Embodiment

Figure 10:
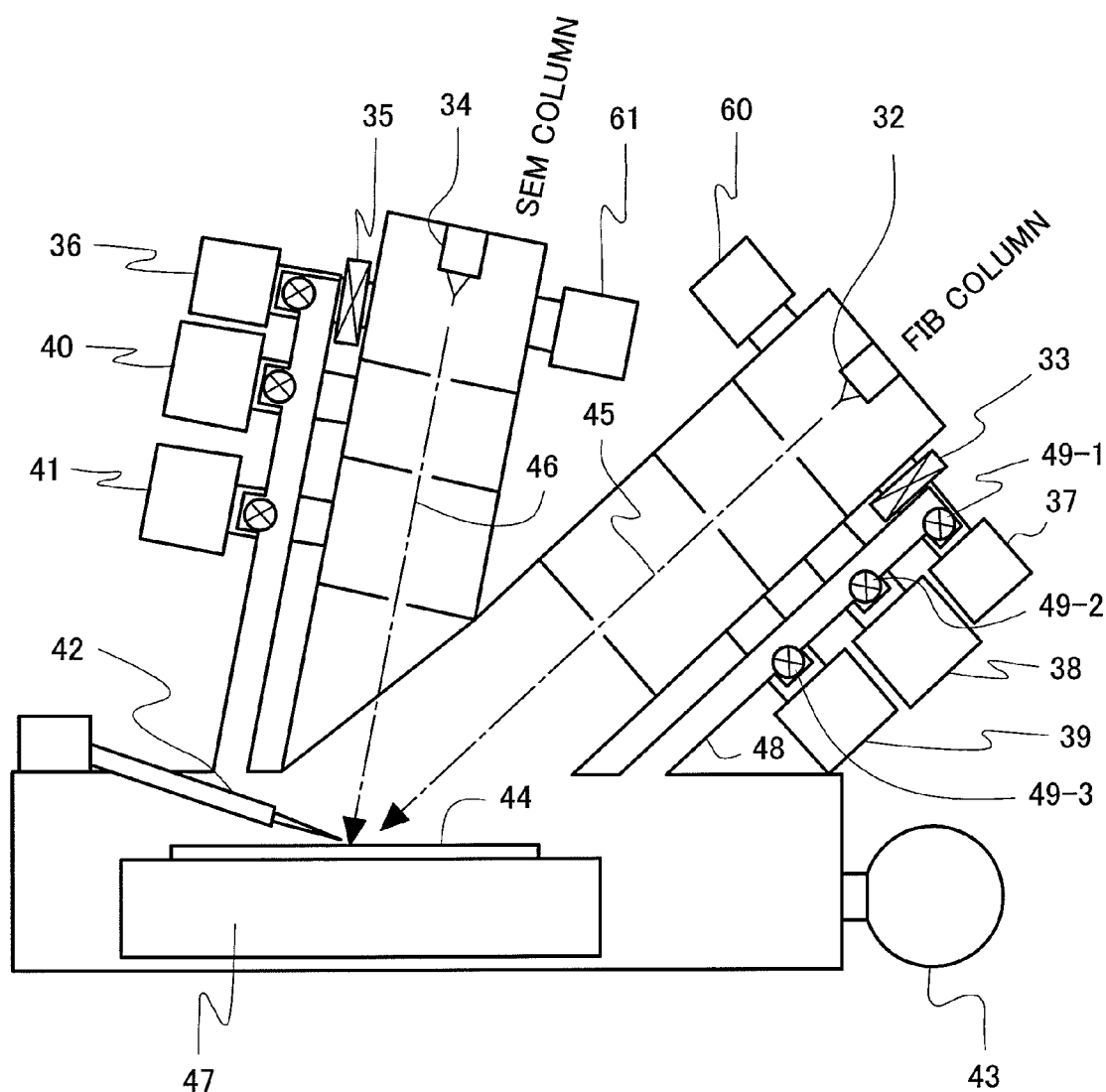
FIG. 10 is a diagram for explaining one configuration example of a micro sampling system which uses the present invention.

In this embodiment, a micro sampling system constructed by applying the present invention to a dual column system having two kinds of columns: a scanning electron microscope column whose outline configuration is shown in FIG. 10 and an ion beam column will be explained.

The micro sampling system is a system that cuts away a part of a semiconductor device etc. for the purpose of inspection and analysis of the device, and observes and analyzes its cross section, and is an apparatus equipped with two kinds columns of the FIB column enabling the sample to be cut out and the SEM column for simultaneously observing a cut-out position and a cut-out cross section which are disposed with an angle to each other. Furthermore, the two columns also make a predetermined angle with a vertical axis normal to the surface of a sample 44 coinciding with the horizontal plane.

An ion source 32 is located in a most upstream vacuum vessel of the FIB column, where a non-evaporable getter pump 37 is provided. Although the ion pump 60 is used as the main pump and the non-evaporable getter pump 37 is used as the subsidiary pump for evacuation of the ion gun chamber in this embodiment, the ion pump 60 may be dispensed with.

A valve 33 according to the present invention exists in the vacuum pipe connecting between the non-evaporable getter pump 37 and the ion gun chamber, and this valve 33 connects a rough pumping port 48 to the non-evaporable getter pump 37 through a rough pumping valve 49. This rough pumping port 48 is bearing a function of performing the rough pumping of a downstream vacuum vessel that differential evacuates the ion gun chamber and a further downstream vacuum vessel. Each of the vacuum vessels and the rough pumping port 48 are configured to be able to select either opening or shutting with an individual rough pumping valve. The vacuum vessels on the downstream side of the ion gun chamber are vacuum-evacuated by individual ion pumps 38, 39.

The evacuation of the other SEM column is done in the same manner. For vacuum-evacuating the most upstream electron gun chamber with the electron source 34 disposed in it, an ion pump 61 is used as a main pump and a non-evaporable getter pump 36 is used as a subsidiary pump. Although in this embodiment, the ion pump 61 is used as a main pump for vacuum evacuating the electron gun chamber and the non-evaporable getter pump 36 is used as a subsidiary pump, the ion pump 61 may be dispensed with.

A method for evacuation from the atmospheric pressure may be the same as the methods described in the First to the Fourth embodiments.

A method for evacuation of the FIB and SEM columns will be explained. For the both columns, a fundamental method for evacuation from the atmospheric pressure to an ultra-high vacuum is as follows.

(1) The valve 33 and rough pumping valves 49-1, 49-2, and 49-3 get opened, and rough pumping is performed using a turbo-molecular pump 43 connecting with the rough pumping port 48. Also on the SEM column side, the same procedure is performed simultaneously.

(2) When the degree of vacuum reaches the range of $10^{-5}$ Pa, heaters (not illustrated) attached to the respective parts are electrified to perform the baking. The heater temperature is maintained at the setup temperature of 200 to 250° C. for about eight hours. This step aims at making gas adhering to the inner wall surface of the vacuum vessel desorb. When this baking is completed, the ion pumps 38, 39 will be electrified and the rough pumping valve 49-2, 49-3 will be shut. Also on the SEM column side, the same procedure is performed simultaneously.

(3) The valve 33 is shut and the non-evaporable getter pump 37 is activated by heating. The heating is done at about 500° C. for one hour. Then, the heating is ended. Also on the SEM column side, the same procedure is performed simultaneously.

(4) The rough pumping valve 49-1 is shut and the valve 33 is opened, and this state is kept held until the degree of vacuum will increase. Also on the SEM column side, the same procedure is performed simultaneously.

By the FIB and the SEM column being subjected to such steps, the both columns can reach an extreme ultra-high vacuum in the range of $10^{-8}$ Pa in a short time, without being affected by a large amount of the desorbed gas generated at the time of the activation of the non-evaporable getter pump.

After the evacuation, when the ion source 32 of the FIB column is electrified to start up the ion source, an ion beam 45 is emitted from its tip. This ion beam 45 passes through an unillustrated electron optics and a diaphragm, is focused at a desired position on the surface of the sample 44, and a predetermined removal processing can be performed.

On the other hand, in a similar manner, an electron beam 46 emitted from an electron source 34 of the SEM column passes through the electromagnetic optics using unillustrated coils and diaphragms, and is focused on a surface of the sample 44, which generates secondary electrons. By detecting the secondary electrons with an unillustrated secondary electron detector, an SEM image can be rendered regardless of being processed with the ion beam or before/after the processing.

A center axis of the FIB column is fixed slantingly, making an angle of 30° with the vertical axis. Moreover, a center axis of the SEM column is slanted to the vertical axis by 45°. Furthermore, the FIB column and the SEM column are fixed so as to make a relative angle therebetween of 90°.

A sample chamber is under the two columns described above, and the turbo-molecular pump 43 performs the evacuation. Moreover, the system has a stage 47 on which the sample 44 is placed and held and capable of moving and positioning it and an arm 42 for performing micro sampling. This micro sampling means is means for handling a minute chip processed by the ion beam.

As described in detail above, according to the present invention, the charged particle beam system equipped with the electron gun chamber or ion gun chamber making combined use of the non-evaporable getter pump which has a short evacuation time and can maintain as high a degree of vacuum as $10^{-7}$ to $10^{-8}$ Pa for a long time and the main vacuum pump.

What is claimed is:

1. A charged particle beam system equipped with a charged particle optics which makes a charged particle beam emitted from a charged particle source incident on a sample and means of evacuation for evacuating the charge particle optics,
    wherein the means of evacuation has:
    a vacuum vessel with a charged particle source disposed in the vessel;
    a non-evaporable getter pump which connects with the vacuum vessel through a vacuum pipe and evacuates the interior of the vacuum vessel as a subsidiary vacuum pump;
    a valve interposed in the vacuum pipe connecting between the vacuum vessel and the non-evaporable getter pump;
    a rough pumping port which is provided closer to the non-evaporable getter pump than the valve and performs rough pumping;
    an open and shut valve for opening and shutting the rough pumping port; and
    a main vacuum pump which is provided closer to the vacuum vessel than the valve and evacuates the interior of the vacuum vessel.

2. The charged particle beam system according to claim 1, wherein the valve interposed in the vacuum pipe connecting between the vacuum vessel and the non-evaporable getter pump is capable of switching a conductance in a range of three orders of magnitude or more and a conductance when the valve is fully opened is 100 L/s or more.

3. The charged particle beam system according to claim 1, wherein the valve interposed in the vacuum pipe connecting between the vacuum vessel and the non-evaporable getter pump is a gate valve.

4. The charged particle beam system according to claim 1, wherein the valve interposed in the vacuum pipe connecting between the vacuum vessel and the non-evaporable getter pump is a butterfly valve.

5. The charged particle beam system according to claim 1, wherein the valve interposed in the vacuum pipe connecting between the vacuum vessel and the non-evaporable getter pump has a mechanism for opening and shutting the vacuum pipe by driving a bimetal.

6. The charged particle beam system according to claim 1, wherein the valve interposed in the vacuum pipe connecting between the vacuum vessel and the non-evaporable getter pump has a mechanism for opening and shutting the vacuum pipe by driving a shape memory alloy.

7. The charged particle beam system according to claim 1, wherein the vacuum vessel is an ion gun chamber with an ion source provided in the chamber.

8. The charged particle beam system according to claim 1, wherein the vacuum vessel is an electron gun chamber with an electron source provided in the chamber.

9. The charged particle beam system according to claim 1, wherein the main vacuum pump is an ion pump.

10. A method for evacuation of a charged particle beam system which has a non-evaporable getter pump connected to a vacuum vessel with a charged particle source disposed in the vessel through an aperture, a valve interposed in the vacuum pipe connecting between the non-evaporable getter pump and the vacuum vessel, a rough pumping port which is provided closer to the non-evaporable getter pump than the valve, an open and shut valve of the rough pumping port, and a main vacuum pump provided closer to the vacuum vessel than the valve, the method comprising the steps of:
    performing rough pumping by opening the open and shut valve of the rough pumping port;
    baking the valve interposed in the vacuum pipe connecting between the vacuum vessel and the non-evaporable getter pump at roughly 250° C. or less;
    cooling the valve to the vicinity of room temperatures after the baking;
    activating the non-evaporable getter pump by heating the pump after shutting the valve interposed between the vacuum vessel and the non-evaporable getter pump after the cooling; and
    opening the valve after the activation.

11. The method for evacuation according to claim 10, wherein the valve interposed in the vacuum pipe connecting between the vacuum vessel and the non-evaporable getter pump is capable of switching a conductance in a range of three orders of magnitude or more and a conductance when the valve is fully opened is 100 L/s or more.

12. The method for evacuation according to claim 10, wherein the valve interposed in the vacuum pipe connecting between the vacuum vessel and the non-evaporable getter pump is a gate valve or a butterfly valve.

13. The method for evacuation according to claim 10, wherein the valve interposed in the vacuum pipe connecting between the vacuum vessel and the non-evaporable getter pump has a mechanism of opening and shutting the vacuum pipe by driving by a bimetal or a shape memory alloy.

14. The method for evacuation according to claim 10, wherein the vacuum vessel is an electron gun chamber with an electron gun provided in the electron gun chamber or an ion gun chamber with an ion source provided in the ion gun chamber.

15. The method for evacuation according to claim 10, wherein the main vacuum pump is an ion pump.

16. A method for evacuation of a charged particle beam system which has a non-evaporable getter pump connected to a vacuum vessel with a charged particle source disposed in the vessel through an aperture, a valve interposed in the vacuum pipe connecting between the non-evaporable getter pump and the vacuum vessel, a rough pumping port which is provided closer to the non-evaporable getter pump than the valve, an open and shut valve of the rough pumping port, and a main vacuum pump provided closer to the vacuum vessel than the valve, the method comprising the steps of:
    performing rough pumping by opening the open and shut valve of the rough pumping port;
    baking the valve interposed in the vacuum pipe connecting between the vacuum vessel and non-evaporable getter pump at roughly 250° C. or less;
    activating the non-evaporable getter pump by heating the pump after shutting the valve interposed between the vacuum vessel and the non-evaporable getter pump after baking; and
    opening the valve after the activation.

17. A charged particle beam system equipped with a charged particle optics for making a charge particle beam emitted from a charged particle source incident on a sample and means of evacuation for evacuating the charge particle optics,
    wherein the means of evacuation has an ion pump and a non-evaporable getter pump which are connected to a vacuum vessel with the charge particle source disposed in the vessel thorough a vacuum pipe, and
    the non-evaporable getter pump is used as a subsidiary pump used together with the ion pump and is set up to evacuate individually at the time of activation.

* * * * *